(12) United States Patent
Kolpekwar et al.

(10) Patent No.: US 7,523,424 B2
(45) Date of Patent: Apr. 21, 2009

(54) METHOD AND SYSTEM FOR REPRESENTING ANALOG CONNECTIVITY IN HARDWARE DESCRIPTION LANGUAGE DESIGNS

(75) Inventors: Abhijeet Kolpekwar, New Berlin, WI (US); Scott Cranston, Haverhill, MA (US); Peter Frey, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 357 days.

(21) Appl. No.: 11/291,445

(22) Filed: Nov. 30, 2005

(65) Prior Publication Data

US 2007/0124706 A1 May 31, 2007

(51) Int. Cl.
*G06F 17/50* (2006.01)
*G06F 9/45* (2006.01)

(52) U.S. Cl. ............... 716/5; 716/1; 716/2; 716/12; 716/13; 716/14

(58) Field of Classification Search ............. 716/1–5, 716/16–18, 12–14
See application file for complete search history.

(56) References Cited

U.S. PATENT DOCUMENTS

| 7,047,173 B1* | 5/2006 | Larky et al. ............ 703/14 |
| 7,082,589 B2* | 7/2006 | Saunders et al. ......... 716/11 |
| 7,181,383 B1 | 2/2007 | McGaughy et al. |
| 7,207,015 B1* | 4/2007 | Ballagh et al. ........... 716/3 |

OTHER PUBLICATIONS

Frey et al., Verilog-AMS: Mixed-Signal Simulation and Cross Domain Connect Modules, 2000, IEEE, pp. 103-108.*
Accellera International, Inc. (Jan. 20, 2003). "Verilog-AMS Language Reference Manual Analog & Mixed-Signal Extensions to Verilog HDL," Manual, Version 2.1, 392 pages.
IEEE-SA Standards Board (Dec. 23, 1999). "IEEE Standard VHDL Analog and Mixed-Signal Extensions," IEEE Std. 1076.1-1999, Manual, 314 pages.

* cited by examiner

*Primary Examiner*—Jack Chiang
*Assistant Examiner*—Nghia M Doan
(74) *Attorney, Agent, or Firm*—Wheelock Chan LLP; Thomas Chan

(57) ABSTRACT

System and method for representing analog connectivity in a design written in a hardware description language are disclosed. The method includes detecting a circuit component that does not have explicit connection path in the design, where the circuit component includes one or more lower-level circuit instances arranged in one or more branches in a hierarchical graph. The method further includes creating one or more instances of the circuit component having at least one additional port than the circuit component, creating one or more ports in the corresponding one or more instances of the circuit component for providing at least an explicit connection path, and representing the design using at least the explicit connection path and the one or more ports of the corresponding one or more instances.

24 Claims, 10 Drawing Sheets

| Verilog - AMS Representation | Hierarchical Representation for FastSpice simulators |
|---|---|
| ```
module  top electrical a,b;
        child #(.r(1.0))  c1(a,b endmodule module  child (n1,n2   );

parameter real r = 5.0;
    electrical    n1,n2, g;
    ground g;

resistor #(.r(r)) r1(n1,n2);
        resistor #(.r(r)) r2(n2, g);

analog  begin
        V(n1, g) <+ 5.0;
    end endmodule
``` | ```
ground glob_gnd subckt   top
    child c1 a b r=1.0
ends suckt    child(n1 n2)
    parameter r alias  g g1   ob_gnd
        resistor r1 n1 n2 r=r
        resistor r2 n2 g  r=r
        child_behav inst1 n1 g ends
``` |

Figure 2

| Verilog-AMS design | Hierarhical-SPICE representation |
|---|---|
| ```
module top;
    electrical n1, g;
    ground g;

clk i1(n1);
    resistor #(.r(1.0))    i2(n1, g);

endmodule module clk(d);
    output d;
    logic  d;
    reg d_tmp;
    assign d = d_tmp;

initial d_tmp = 1'b0;

always begin
        #1; d_tmp = ~d_tmp;
    end
endmodule
``` | ```
ground glob_gnd;

subckt   top
    alias g, glob_gnd;

D2A n1 _D2A_ logic in
    resistor n1 g r=1.0 ends subckt   D2A aout
    D2A_behav inst1 aout ends
``` |

Figure 4

| Verilog-AMS design | Hierarhical-SPICE representation |
|---|---|
| ```
module top;
  electrical g;
  ground g;
  logic n1;

clk i1(n1);
  resistor #(.r(1.0)) i2(n1, g);
endmodule module clk(d);
  output d;
  logic d;
  reg d_tmp;
  assign d = d_tmp;

initial d_tmp = 1'b0;

always begin
    #1; d_tmp = ~d_tmp;
  end
endmodule
``` | ```
ground glob_gnd;

subckt top
  alias g, glob_gnd;

D2A n1__D2A__electrical
  n1__D2A_electrical+aout resistor r1
  n1__D2A_electrical+aout g
  r=1.0 ends subckt D2A aout
  D2A_behav inst1 aout
ends
``` |

Figure 5

| Verilog-AMS design | Hierarhical-SPICE representation |
|---|---|
| ```
connectrules    myrules
    connect A2D
        inout electrical
        inout logic
endconnectrules module top;
    electrical top.c1.n1;
    logic top.c2.n1;

child c1();
    child c2();

endmodule module child ;
    wire n1;
    electrical g;
    ground g;

vsource #(.dc(1.0)) v1(n1,g);
    resistor #(.r(1.0)) r1(n1,g);

endmodule
``` | ```
.ground glob_gnd;

subckt    top
    child_flavor1 c1
    child_flavor2 c2
ends subckt  child_flavor1
    .alias g glob_gnd vsource  v1 n1 g dc=1.0
    resistor r1 n1 g r=1.0 ends subckt   child_flavor2
    alias g glob_gnd

A2D n1_A2D__electrical
              n1_A2A__electrical+ain vsource v1
              n1_A2A__electrical+ain g
              dc=1.0 resistor r1
              n1_A2A__electrical+ain g
              r=1.0 ends
``` |

Figure 6

| Verilog - AMS design | Hierarchical - SPICE representation |
|---|---|
| ```
module top;
    defparam top.c2.il.p = 5.0;
    child c1();
    child c2();
endmodule module child ;
    leaf #(.p(2.0)) il();
endmodule module leaf ;
    parameter real    p = 2.5;
    electrical nl, g;
    ground g;

vsource #(.dc(p)) vl(nl, g);
    resistor #(.r(1.0)) rl(nl,g);
endmodule
``` | ```
.ground glob_gnd;

. subckt   top
        child_flavor1 c1
        child_flavor2 c2
. ends

. subckt    child_flavor1
        Leaf il p=2.0
  ends subckt    child_flavor2
        leaf il p=5.0
  ends subckt   leaf;
        parameter p = 2.5
        .alias g glob_gnd vsource  vl nl g dc=p
        resistor rl nl g r=1.0 ends
``` |

Figure 7

| VHDL-AMS design | Hierarhical-SPICE representation |
|---|---|
| `package std_decls is`<br>`  subtype current is real;`<br>`  subtype voltage is real;`<br><br>`  nature electrical is`<br>`    voltage across`<br>`    current through`<br>`    ground referen   ce;`<br><br>`  terminal t5,t6: electrical;`<br>`end ;`<br><br>`use  work.std_decls.all`<br><br>`entity  test_ent is`<br>`end  test_ent;`<br><br>`architecture   test_arch`<br>`           of test_ent is`<br>`  quantity v across i through`<br>`           t5 to t6;`<br>`begin`<br>`  v == 3.0 * i;`<br>`end  test_arch;` | `.ground glo  b_gnd;`<br>`.global std_decls+t5`<br>`.global std_decls+t6`<br><br><br>`subckt    std_decls t5 t6`<br><br>`ends`<br><br><br>`subckt    work+test_ent+test_arch`<br><br>`           work+test_ent+test_arch_behav`<br>`           inst std_decls+t5 std_decls+t6`<br><br>`ends`<br><br>`std_decls  std_decls`<br>`           std_decls+t5 std_decls+t6`<br><br>`work+test_ent+test_arch`<br>`           work+test_ent+test_arch` |

Figure 8

| Instance | Number of OOMRs | Local Nets in target OOMR | Immediate Children information |
|---|---|---|---|
| top.i1 | 1 | Net "x" | Not Applicable since it is a leaf level cell |
| top.i2.i1 | 1 | Net "x" | Not Applicable since it is a leaf level cell |
| top.i2.i7 | 0 | None | Not applicable since it is a leaf level cell |
| Top.i6.i7 | 1 | Net "y" | Not applicable since it is a leaf level cell |

Figure 9

| Cell1 Flavor1 | Cell1 Flavor2 | Cell1 Flavor3 |
|---|---|---|
| subckt cell; <br><br> ends | subckt cell x <br><br> ends | subckt cell y <br><br> ends |

Figure 10

METHOD AND SYSTEM FOR REPRESENTING ANALOG CONNECTIVITY IN HARDWARE DESCRIPTION LANGUAGE DESIGNS

FIELD OF THE INVENTION

The present invention relates to the field of electronic design automation tools. In particular, the present invention relates to a method and system for representing analog connectivity in hardware description language designs.

BACKGROUND OF THE INVENTION

The development of complicated integrated circuits often requires powerful numerical simulation programs. For example, circuit simulation is an essential part in the design flow of integrated circuits, helping circuit designers to verify the functionality and performance of their designs without going through expensive fabrication processes. Examples of electronic circuit simulators include the Simulation Program with Integrated Circuit Emphasis (SPICE) developed at the University of California, Berkeley (UC Berkeley), and various enhanced versions or derivatives of SPICE, such as SPECTRE, developed by Cadence Design Systems, Inc. SPICE and its derivatives or enhanced versions will be referred to hereafter as SPICE circuit simulators, or SPICE.

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc. SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j$ (j= 1, ..., n) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

A complex integrated circuit may contain millions of circuit elements such as transistors, resistors, and capacitors. The design and simulation of such a complex integrated circuit may involve multiple teams of engineers. It is advantageous to partition the design of such complex integrated circuit using a hierarchical approach, whereby certain circuit elements are grouped together and may be reused repeatedly through the integrated circuit or in a subsequent design. A method and system for design and simulation of an integrated circuit with a hierarchical data structure are disclosed by U.S. patent application Ser. No. 10/724,277, entitled "System and Method for Simulating a Circuit Having Hierarchical Structure," which, filed on Nov. 26, 2003 and commonly owned by Cadence Design Systems, Inc., is incorporated expressly by reference in its entirety herein.

FIG. 1 illustrates a physical representation and a hierarchical representation of a design. In the physical view, each device is realized. This is equivalent to traditional simulation technologies in which each device is usually represented by one or more differential equations which will be solved for. The much more compact hierarchical representation of a design is used commonly for schematic design representation and block modeling. With the arrival of the hierarchical-SPICE simulation paradigm, this principle of compact design representation moved also into the simulator space. The huge speed and capacity advantages of hierarchical-SPICE simulators are actually due to the compact design representation and therefore much effort is spend in the hierarchical-SPICE simulators to keep this representation as compact as possible.

Hierarchical SPICE simulation technology is targeted towards high speed and very large capacity full chip verification. It requires a hierarchical representation of the design to minimize the memory imprint and improve simulation performance. Hierarchical-SPICE simulators, such as the Ultrasim product by Cadence Design Systems, Inc, have the ability to simulate designs containing more than one billion devices. Such simulators require a hierarchical representation of the design in order to optimize the memory imprint.

Mixed-signal hardware description languages (HDLs), such as Verilog-AMS and VHDL-AMS, provide many powerful features to aid in modeling of complex mixed-signal designs. For VHDL-AMS designers, the "IEEE Standard VHDL Analog and Mixed-Signal Extensions" was published by IEEE-SA Standards Board on Dec. 23, 1999. For Verilog-AMS designers, the "Verilog-AMS Language Reference Manual" was published by Accellera International Inc. on Jan. 20, 2003. Although both these HDL languages are hierarchical in nature, they contain complex modeling features that prevent them from mapping into hierarchical representations that Hierarchical-SPICE simulators can understand. There are two key features of the HDL languages that prevent them from being represented in a Hierarchical-SPICE representation: 1) ability to refer objects out of context without having an explicit connection path; and 2) ability to create implicit instances without having users to explicitly specify them in the source. These features include Verilog-AMS out-of-module-references (OOMRs), domain-less nets, and automatic insertion of connection modules (AICMs), Verilog defined parameters (defparams), VHDL-AMS package references, VHDL-AMS entity, VHDL-AMS architecture, and VHDL-AMS instantiations.

To take advantage of the benefits of Hierarchical-SPICE simulation technology, designs written in these HDL languages need to be processed to make the modeling features compliant to requirements of Hierarchical-SPICE simulators. Therefore, there is a need for a memory-efficient way in which hierarchical units of HDL such as Verilog-AMS and VHDL-AMS are refashioned at different points in the hierarchy to reflect the presence of these complex features to allow for simulation by a Hierarchical-SPICE simulator.

SUMMARY

In one embodiment, a method for representing analog connectivity in a design written in a hardware description language includes detecting a circuit component that does not have explicit connection path in the design, where the circuit component includes one or more lower-level circuit instances arranged in one or more branches in a hierarchical graph. The method further includes creating one or more instances of the circuit component having at least one additional port than the circuit component, creating one or more ports in the corresponding one or more instances of the circuit component for providing at least an explicit connection path, and representing the design using at least the explicit connection path and the one or more ports of the corresponding one or more instances.

In another embodiment, a system for representing analog connectivity in a design written in a hardware description language includes at least one processing unit for executing computer programs, a user interface for performing at least one of the functions selected from the group consisting of entering a netlist representation of the circuit and viewing representations of the circuit on a display, and a memory for storing the computer programs. The system further includes means for detecting a circuit component that does not have explicit connection path in the design, where the circuit component includes one or more lower-level circuit instances arranged in one or more branches in a hierarchical graph, means for creating one or more instances of the circuit component having at least one additional port than the circuit component, means for creating one or more ports in the corresponding one or more instances of the circuit component for providing at least an explicit connection path, and means for representing the design using at least the explicit connection path and the one or more ports of the corresponding one or more instances.

In yet another embodiment, a computer program product for representing analog connectivity in a design written in a hardware description language comprises a medium that stores executable program code. The computer program product includes code for detecting a circuit component that does not have explicit connection path in the design, where the circuit component includes one or more lower-level circuit instances arranged in one or more branches in a hierarchical graph, code for creating one or more instances of the circuit component having at least one additional port than the circuit component, code for creating one or more ports in the corresponding one or more instances of the circuit component for providing at least an explicit connection path, and code for representing the design using at least the explicit connection path and the one or more ports of the corresponding one or more instances.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

FIG. 2 illustrates a hierarchical representation of a Verilog-AMS design for Fast SPICE simulation according to an embodiment of the present invention.

FIG. 4 illustrates a method for representing AICMs from an electrical-net to a logic-net according to an embodiment of the present invention.

FIG. 5 illustrates a method for representing AICMs from a logic-net to an electrical-net according to an embodiment of the present invention.

FIG. 6 illustrates a method for flavor generation of cell child due to AICMs according to an embodiment of the present invention.

FIG. 7 illustrates a method for representing Verilog-AMS defparams according to an embodiment of the present invention.

FIG. 8 illustrates a method for resolving packaged terminal references according to an embodiment of the present invention.

FIG. 9 illustrates a method for flavor generation of master definition Cell1 of FIG. 3 according to an embodiment of the present invention.

FIG. 10 illustrates flavor definitions of Cell1 of FIG. 3 according to an embodiment of the present invention.

DESCRIPTION OF EMBODIMENTS

Figure 1:
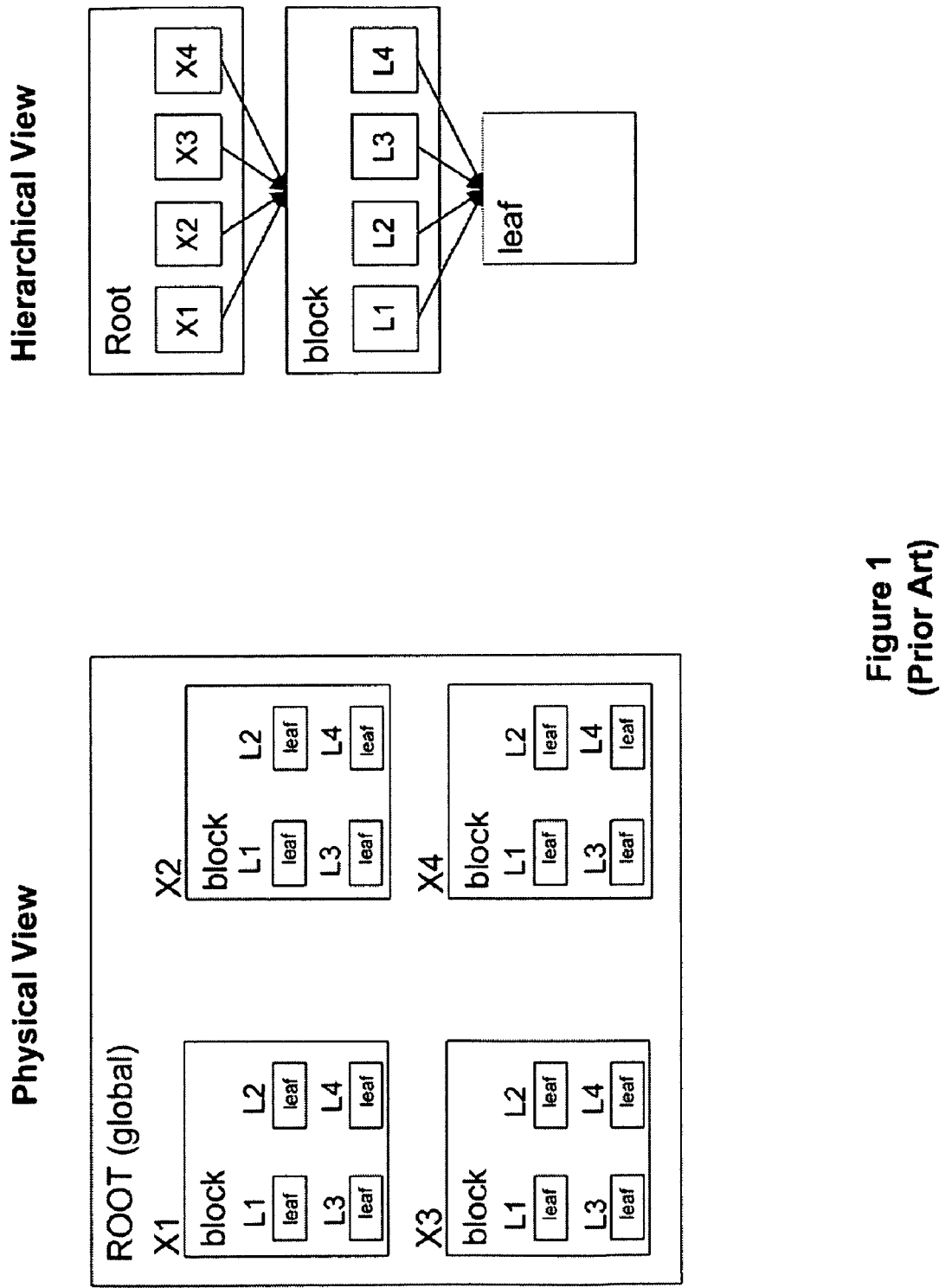
FIG. 1 illustrates a physical representation and a hierarchical representation of a design.

Methods and systems are provided for representing analog connectivity in mixed-signal mixed-language designs for hierarchical SPICE simulation. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description which follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

In this disclosure, approaches for representing analog connectivity in a mixed-language mixed signal design environment are described. The approaches include: 1) creating extra ports and instances on the HDL design units to define the explicit connection paths for HDL features such as Verilog-AMS out-of-module-references (OOMRs), and automatically inserted connection modules (AICMs); 2) creating multiple copies (also known as flavors in this specification) of a given HDL design unit whose hierarchical representation can vary from one instance to another (due to HDL features such as OOMRs, defparams, AICMs etc.); 3) optimizing the number of flavors required for a give design unit. Note that even though specific examples in Verilog-AMS and VHDL-AMS are used to explain the approaches, these approaches are extensible to enhancements in other behavioral modeling languages.

In some embodiments, the method to create extra ports and instances in a given design unit is to represent an explicit connection path for every net reference (such as OOMRs) and also to convert all the implicit instances (such as AICMs) into explicit instances in the design. To do this requires modifications to the design unit definition by adding extra ports and child instances. The background of OOMRs and various types of OOMRs and a detailed algorithm on how such OOMRs connections are represented in Hierarchical-SPICE representation are described below. Note that OOMRs can lead to additional ports on the design units as well as on its immediate child instances. AICMs, on the other hand, add additional immediate child instances to the design unit and may also require changing net connections to other immediate child instances.

FIG. 2 illustrates a hierarchical representation of a Verilog-AMS design for Fast SPICE simulation according to an embodiment of the present invention. In this case, the Verilog-AMS design in the left column declares an electrical net "g" as ground in the scope of module "child". In the hierarchical representation for Fast SPICE simulation, Node "g" is aliased to "glob_gnd",which is declared as a global ground node. This allows for support of the "ground" keyword in Verilog-AMS in any scope. The Verilog-AMS representation of the design in the left column uses analog behavioral block to define a voltage source of 5.0 volts. In the hierarchical representation in the right column, this analog behavior is encapsulated by creating and instantiating a separate device, namely "child_behav". All the analog nets used in the analog behavioral block are connected to the terminals on this new device as explicit paths.

In Verilog-AMS, out-of-module-references to nets are used to refer nets from one instance to another using their hierarchical name. Such references are made without any connections paths through the ports of instances. The lack of explicit connection path makes it difficult to directly map such references to hierarchical-SPICE representation. To represent such references, explicit connection paths need to be "drilled" from the source to the target of OOMR. Based on the connectivity features, three classes of OOMRs are introduced, namely target OOMRs, reference OOMRs, and pass-through OOMRs.

Figure 3:
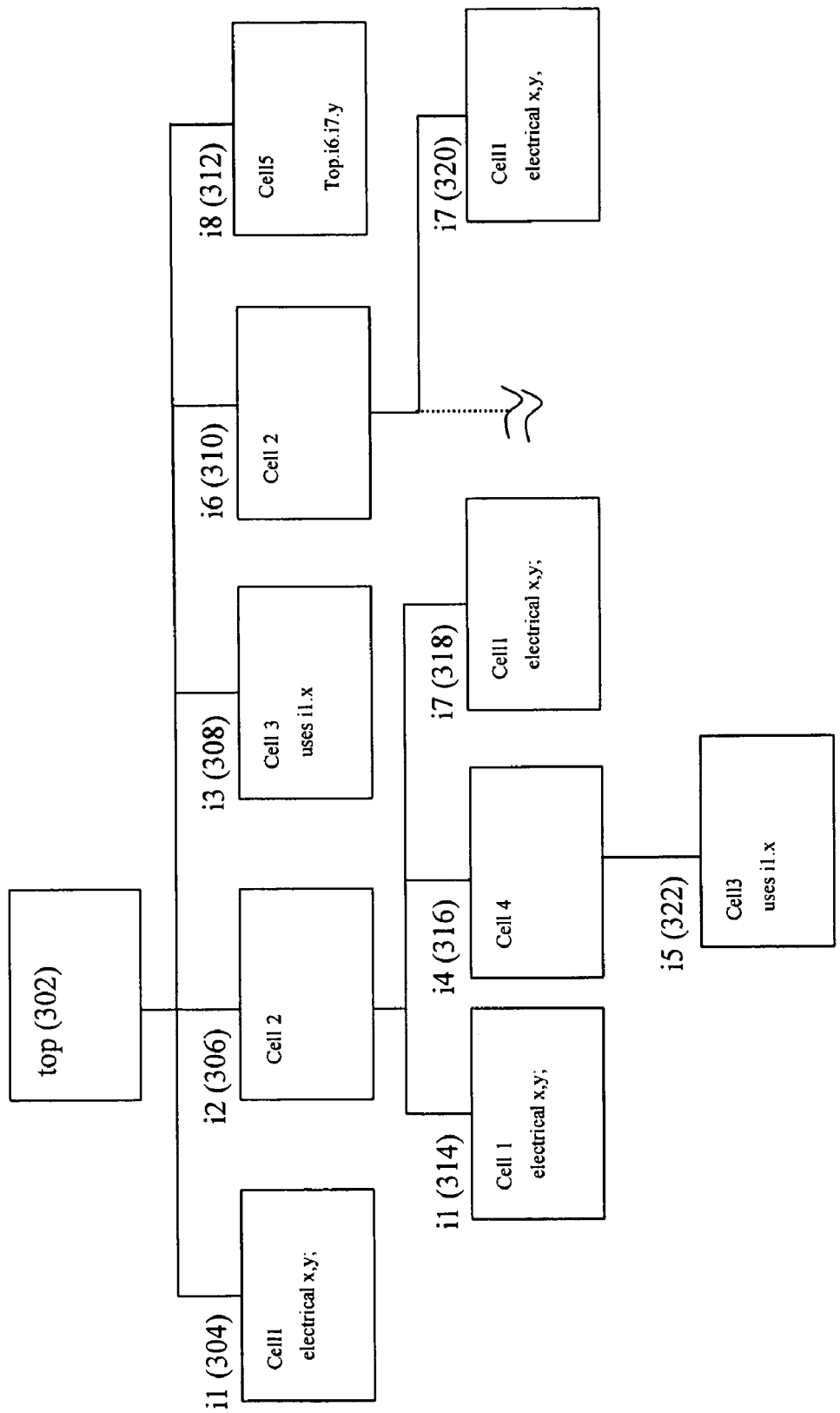
FIG. 3 illustrates target, reference, and pass-through OOMR classes according to an embodiment of the present invention.

FIG. 3 illustrates target, reference, and pass-through OOMR classes according to an embodiment of the present invention. In this case, the design includes a top-level instance top (302), five instances i1 (304), i2 (306), i3 (308), i6 (310), and i8 (312). In instance i2 (306) further includes three instances i1 (314), i4 (316), and i7 (318); and the instance i4 (316) includes instance i5 (322). The instance i6 (310) includes an instance i7 (320). Note the instance i1 appears in the hierarchical design as top.i1 and top.i2.i1 and the instance i7 appears in the hierarchical design as top.i2.i7 and top.i6.i7.

Target OOMRs are the in-context objects that are referred from some other parts of the design. These can be considered as resolved values of the OOMRs. In FIG. 3, nets top.i1.x and top.i2.i1.x are target OOMRs since these are referred from top.i3 and top.i2.i4.i5 respectively using OOMR.

Reference OOMRs are the references made using hierarchical names. These can be considered as "sources" of OOMRs. In FIG. 3, the instances of Cell3 (top.i3 and top.i2.i4.i5) use a reference OOMR i1.x. Note that the resolved value of the reference OOMR i1.x in the two instances is different. Thus, the resolved value of an OOMR depends on where in the hierarchy it is used.

Pass-through OOMRs reside in instances that lie in the hierarchical path from source to target of an OOMR, but do not explicitly refer to the target OOMR in question. In FIG. 3, the OOMRs i1.x in the instance top.i2.i4.i5 creates pass-through OOMRs in the instances top.i2 and top.i2.i4, since the path from reference to target (top.i2.i1.x) passes these instances. Note that these cells do not use the target OOMRs in their definitions.

With these class definitions, any particular OOMR in a particular instance belongs to exactly one class. There is a one-to-many mapping between a target OOMR and the pass-through and source OOMRs associated with it. In other words, there exist distinct sets of equivalent OOMRs, each includes one target OOMR. All OOMRs that lie in the same set have explicit connection paths created for them.

Using these three classes of OOMRs, an algorithm to create explicit hierarchical connection paths for OOMRs as required for Hierarchical-SPICE representation is developed. This process may result in extra terminals on the cell definitions that contain OOMRs (any of the above classes) and/or on their immediate children. For example, in FIG. 3, top.i1 and top.i2.i1, which are instances of Cell, need an additional port to create a path for the target OOMRs inside Cell. Also, the creation of such extra ports can vary from one instance to another. For example, top.i2.i7, another instance of Cell1, does not require an additional port, since it contains no target OOMRs. This method leads to multiple flavors (copies) of the master definition (i.e. the design cell). In the interest of performance optimization, the creation of such flavors of master definition needs to be kept to a minimum. The algorithm also includes this flavor generation requirement.

The input to the algorithm is the Verilog-AMS and/or VHDL-AMS netlist and the output is the hierarchical-SPICE representation of the design with explicit OOMR path connections. The algorithm operates on the following input from the Verilog-AMS/VHDL-AMS netlist: a list of analog-related instances in the depth-first order, where analog-related instances are the AMS instances that contain analog behavior/nets or have analog instances reside in a lower level of the hierarchical representation. In addition, associated with each analog-related instance includes the following information:

a. The list of target, reference, or pass-through OOMRs that reside in the instance. The list maintains an analog node associated with OOMR nets. An analog node (as per Verilog-AMS LRM) may be associated with multiple nets, at various levels of hierarchy that are connected to each other through port connection. This analog node is common to all OOMRs in a set of equivalent OOMRs, and is unique to that particular set.

b. Associated with every OOMR is a flag that indicates whether the OOMR needs to be passed up the hierarchy. This is set when the hierarchical parent of this instance contains an OOMR which lies in the same set of equivalent OOMRs as the current one.

c. Associated with every pass-through and reference OOMR is a local name which is used for net binding in the master definition of the instance. For target OOMR, the name of the local net is used.

d. Associated with every OOMR is a list of immediate child instances that include an OOMR in the same set of equivalent OOMRs as the current one.

The algorithm for creating an OOMR path is described below according to an embodiment of the present invention.

```
For Each analog-related instance (in the depth-first order),
    If the list of OOMRs (as explained above) associated with the instance
    is empty,
        Bind the instance to the master definition provided in the design
        (since no changes to master definition is required).
        Move to the next analog-related instance.
    If the list of OOMRs associated with the instance is not empty
Find out if flavor of the master required for such an instance is already
created.
If yes, bind the instance to that master and move to the next analog-related
instance. If not, continue below. (Flavors are altered copies of the master
definition. The details are described below.)
For each OOMR in the list,
    If it is a reference OOMR,
        Create a local net with the name associated with the OOMR and
        replace all OOMR references with this local net.
    If it is a pass-through OOMR,
        Create a local net with the name associated with the OOMR
    If it is a target OOMR,
        Do nothing because there is already a local net present in the
        cell
    If OOMR needs to be passed up the hierarchy, then create an
    additional port in the new cell definition and connect the OOMR
    net to it.
    For each child instance (if any) associated with the OOMR
        Get the master definition associated with the child instance, get
        the list of ports on the child connection
        For each port, get its corresponding analog node and compare it
        with the analog node associated with the OOMR
        If there is a match, add the OOMR net to port map of child
        instantiation.
        If none of the ports match, it is a fatal error (This cannot
        happen)
        Change the name of the child master to its flavored master
    Go to next OOMR
Create the new copy (i.e. flavor) of the master definition with altered
information (i.e. additional ports, additional local nets, and altered child
instantiations. Change the name of the master to indicate that it is a
flavor of the original master definition.
Bind the instance to the new master definition generated.
Go to the next analog-related instance.
```

According to Verilog-AMS LRM, AICMs are special implicit instances that are generated by the tool on the fly for making net connections from one domain to another (i.e. for connecting a digital object with an analog object). Such instances are not explicitly specified by the user in the design. For the purpose of Hierarchical-SPICE simulation, such implicit instances need to be exposed and registered with the simulator. In this case, an approach to represent such instances for Hierarchical-SPICE simulation is described. For Hierarchical-SPICE representation, the following AICM features need to be addressed:

Feature 1: The instances are implicit and do not appear in master definition of a cell provided by the user.

Feature 2: The insertion of these instances can vary from one instance to another for a given cell. In other words, various instances of the same cell may or may not require AICMs. Also, if they do require AICMs, the instantiations of AICMs can vary from one instance to another.

Feature 3: The insertion of such instances may require generation of an additional analog net to represent the converted analog value.

To address feature 1, a flavor of the master that instantiates the AICM is created and presented as an additional child to register with Hierarchical-SPICE simulator. Feature 2 will be addressed by the flavor generation and management scheme described in association with FIG. 9 and FIG. 10. As will be discussed below, the creation of flavors is dependent on the instantiation statements of the immediate children. Since AICMs are the immediate children, their presence and the instantiation statements contribute to defining a flavor. To address feature 3, a new local net in the master that instantiates the AICM is created. This is illustrated by the example shown in FIG. 6. Note that the upper connection of an AICM is a net, while the lower connection is a port of the child instance. The following example illustrates these two cases: 1) an electrical-net connected to logic from a lower-level instance; and 2) a logic-net connected to electrical from a lower-level instance.

```
logic: A discrete Verilog-AMS discipline
electrical: A continuous Verilog-AMS discipline
A2D: A connect module that converts value (i.e. potential) of an electrical
net to its corresponding value in digital domain.
    module A2D (ain, dout)
        input ain;
        output dout;
        electrical ain;
        logic dout;
        ...
    endmodule
D2A: A connect module that converts value of digital net to its
corresponding value in analog domain.
    module D2A (din, aout)
        input din;
        output aout;
            logic din;
        electrical aout;
        ...
    endmodule
myrules: A Verilog-AMS connect rule specified by the user that dictates
automatic insertion of Connect rules
    connectrules myrules;
        connect D2A input logic, output electrical;
        connect A2D input electrical, output logic;
    endconnectrules
```

FIG. 4 illustrates a method for representing AICMs from an electrical-net to a logic-net according to an embodiment of the present invention. As shown in the left column of FIG. 4, an analog net top.n1 is connected by a digital net (top.i1. d) from a lower-level instance. An AICM needs to be inserted between the net top.n1 and the digital port of the instance top.i1. In the Hierarchical-SPICE representation shown above, this AICM instance is explicitly declared as (top.n1_D2A_logic). This results in the creation of modified definition (i.e. flavor) of the cell top in the right column. Note that only analog nets and cells are required to be published in the Hierarchical-SPICE representation. For example, the digital port din of the D2A, the cell clk, and the instance top.i1 are not published in the right column.

FIG. 5 illustrates a method for representing AICMs from a logic-net to an electrical-net according to an embodiment of the present invention. FIG. 5 is similar to FIG. 4 except the net top.n1 is made explicitly logic (i.e. digital) in FIG. 5. So, this example indicates the connection of digital top.n1 to electrical net (port of resistor) from instance top.i2 from a lower-level instance. The AICM is inserted between the net top.n1 and the port of the instance top.i2. The right column shows the AICM instance (top.n1_D2A_electrical) in the top. This leads to a modified (i.e. flavor) definition of top. Note the creation of a new local net "n1_D2A_electrical+aout" in the cell top. This net is created to make the AICM connection and represent the analog value of the digital net n1 generated by the connect module. The resistor instance top.i2 then reads the analog value using this new net. The digital net top.n1 is not published in the right column. The same applies to the instance top.i1 and the cell clk.

As discussed above, the AICMs may lead to flavor creations for masters that instantiated them. FIG. 6 illustrates a method for flavor generation of cell child due to AICMs according to an embodiment of the present invention. As shown in the left column, the cell child uses a domainless net. This net is represented in analog domain in the instance top.c1 and is represented in digital domain in the instance top.c2 using an out of module discipline declaration from cell top. This requires an analog-to-digital AICM between the net top.c2.n1 and the one port from each of top.c2.v1 and top.c2.r1. Note that since top.c1.n1 is in the analog domain, no AICMs is required for instance top.c1. Thus, the instance top.c1 requires a definition of child with no AICM while the instance top.c2 requires the definition of child with AICM. This leads to flavor generation of the instance child. The right column of FIG. 6 shows the flavor generation of child as child_flavor1 and child_flavor2. These flavors are bound to the master definitions for instances top.c1 and top.c2 respectively as shown in the cell top.

An algorithm for representing AICMs in Hierarchical-SPICE format is described according to an embodiment of the present invention. The input data to the algorithm is a list of analog-related instances in a depth-first order, where associated with every analog-related instance is a list of AICMs that have been inserted. The following steps describe the algorithm for representing AICMs:

```
For each analog-related instance
    Determine whether the master definition (i.e flavor) required
    for this instance is already created. If yes, move to next
    analog-related instance. If no, go to next step.
    For each AICM inserted, check the upper connection (i.e. a net)
        If the upper connection is digital analog
            Get the name of the upper connection
                If it is a reference OOMR
                    Use the name associated with it, a new
                    local net with the associated name is created.
                Represent the AICM instance in the Hierarchical-
                SPICE format using its master name, instance name
                and the upper connection name as a port. If there are
                parameter overrides, they can be mapped without
                any changes.
```

```
-continued

If the upper connection is digital
            Create a new local net. In one example, the name
            "<AICM instance name> + <AICM analog port
            name>" is used.
            Traverse through all the lower connections (i.e. port
            connections of the child instance) of the AICM
                Replace each lower connection with the new
                local net.
                This step results in changing the child
                instantiation.
        Go to next AICM child
    Go to next analog-related instance.
```

Flavors of a cell are generated based on the number of AICM children in its instance and the instantiation statements of AICMs. As a result, the flavor signature comprises: 1) number, 2) instance names, 3) master names, 4) ports, and 5) parameter overrides of AICMs. In general, flavors are generated for any change in the instantiations of the immediate child (including non-AICMs ones) from one instance to another. Various HDL feature including OOMRs, AICMs and defparams (to be explained next) may cause changes in the child instantiations.

The Verilog-AMS standard defines a defparam feature that allows overriding of instance parameters using out-of-module-references. Such OOMRs cannot be directly represented in Hierarchical-SPICE netlist. Therefore such references need to be resolved before they are represented in Hierarchical-SPICE netlist. One approach to resolve the Verilog-AMS defparam is to create flavors of the master whose immediate child instance is subjected to defparam.

FIG. 7 illustrates a method for representing Verilog-AMS defparams according to an embodiment of the present invention. As shown in the left column, in the cell top, the defparam is set on the parameter p of instance top.c2.i1. This results in the flavor generation of the immediate parent of this instance (i.e. cell child) as shown in the right column. In child_flavor1, (used for instance top.c1) the effect of defparam is not realized. However, in child_flavor2, the defparam effect is realized by instantiating top.c2.i1 with parameter value of 5.0 (i.e. the defparam value). Note that the effect of flavor generation is propagated up in the hierarchy. In other words, flavor creation for cell child leads to changed definition of cell top as well. This applies to any kind of flavor creation.

An algorithm for representing Verilog-AMS defparams in Hierarchical-SPICE format is described below. The input data to the algorithm includes a list of analog-related instances in the depth-first order, and a list of defparams defined on its immediate children associated with every instance. The following steps describe an algorithm for representing Verilog-AMS defparams:

```
For every analog-related instance
    If the master definition (flavor) is already created for this instance,
    go to next analog-related instance. If not, go to next step.
    For every child instance that contains defparams
        If the parameter used in defparam is present in the parameter
        overrides, replace the overridden value with the defparamvalue (as
        shown in instance i1 of child_flavor2 as shown in FIG. 7).
        If parameter used in defparam is not present in the parameter
        overrides, add it using the defparam value.
        Go to next child instance that contains defparam.
    Go to next analog-related instance.
```

A defparam is created in a flavor generation of the immediate parent of the instance on which the defparam is set. As a result, the flavor signature comprises the number of defparams on the child instances, and the value, parameter name, and the instance name associated with each defparam.

VHDL-AMS uses entity and architecture declarations to define a design unit (i.e. a cell). More than one architectures can be bound by a given single entity. In the Hierarchical-SPICE representation, a cell is created per VHDL-AMS architecture. The cell is named using the library, entity, and architecture names to ensure uniqueness.

VHDL-AMS also allows for various kinds of constructs to define child instances. This includes direct instantiation, component declarations and instantiations, and configuration specifications. In one implementation, all such constructs are converted into direct instantiations for Hierarchical-SPICE representation. The flavors of the architecture may be created if the signature (i.e. name, port maps, and generic maps) of the resulting direct instantiation changes from one instance to another. The flavor generation and management scheme described above allows for flavor generation due to immediate child instances.

An algorithm for representing VHDL-AMS child instances in Hierarchical-SPICE format is described below. The input data to the algorithm is a list of analog-related instances in depth-first order. The steps of the algorithm are as follows:

```
For each analog-related instance
   If the required master definition (or its flavor) already exists, move to
   next analog-related instance. If not, go to next step.
   If a configuration specification is attached to this instance, create a
   separate flavor of the master definition using the information in the
   configuration specification.
   Go through the immediate child instances. For each child instance:
      If it is a direct instantiation (that uses direct entity, architecture
      reference), represent it in the Hierarchical-SPICE format using
      its entity, architecture name, instance name, port maps, and
      generic map. The master name of the child is obtained from the
      cell associated with the child instance.
      If it is a component instantiation or an instantiation with configuration
      specification, extract the information about entity, architecture names,
      instance name, port maps, and generic maps, and then map them to
      Hierarchical-SPICE instance. Note that port maps and generic maps
      must use only the ports and generics from the entity/architecture
      being instantiated. No intermediate generics/ports used in
      component/configuration specification are allowed to be used in the
      instance that is represented in the Hierarchical-SPICE format. The
      master name of the child is obtained from the cell associated with the
      child instance.
      Go to next immediate child instance.
Go to next analog-related instance.
```

VHDL-AMS LRM allows terminals to be defined in the packages and to be accessed from various cells (i.e. VHDL-AMS architectures) in the design. For such package terminal references, an approach similar to Verilog-AMS global reference handling is employed. In this case, VHDL-AMS packages are represented as separate cells in Hierarchical-SPICE representation. These cells are then instantiated at the global scope. All the terminals inside the packages are copied out to the global scope with the changed name (for example, package_name+terminal_name). All references to packaged terminals are then changed to package_name+terminal_name.

FIG. 8 illustrates a method for resolving packaged terminal references according to an embodiment of the present invention. A VHDL-AMS design that uses packaged terminal references (std_decls.t5 and std_decls.t6) is shown in FIG. 8. As shown in the right column, these terminals are copied to the global scope as std_decls+t5 and std_decls+t6. All references to these terminals from the cell test_ent are changed to std_decls+t5 and std_decls+t6.

An algorithm for representing VHDL-AMS package references in Hierarchical-SPICE format is described below. The steps of the algorithm are as follows:

```
For every package containing VHDL-AMS terminals
   Create a corresponding cell in the global scope in Hierarchical-SPICE
   format.
   For every terminal in the package
      Create a port to the cell with the terminal name
      Create a signal at the global scope with the name
      "<package_name>+<terminal_name>".
   Create an instance of the new cell at the global scope and pass the
   new global signals to it.
For every reference to packaged terminals
   Convert the references using "<package_name>+<terminal_name>".
```

Note that the above approach may be applied to other mechanisms in resolving global signals. Although this approach does not describe the details of Verilog-AMS, VHDL-AMS and SPICE name spaces, a name mangling scheme may be created to resolve any name space differences and may be tailored to address requirements of a particular tool.

In other embodiments, methods for creating flavors of a design unit are described. As discussed above, a HDL design unit definition may be modified to service HDL features such as OOMRs and AICMs. Such modifications depend on the instances of the design unit (for example, the kind of OOMRs pass-through the instances, the kind of AICMs are introduced in the instance, and whether there are defparams defined on its immediate child) and may vary from one instance to another. The method for creating flavors of a design unit focuses on identifying constructs and/or situations that may change from one instance of a design unit to another leading to flavors of a design unit. Some important flavor creating situations include: 1) a list of OOMRs (number and the type of OOMRs) associated with an instance; 2) a list of AICMs (number, type and the location) in a given instance; 3) a list of defparams (the child parameter) of the immediate child instance; and 4) the instantiation statements (i.e design unit name, instance name, parameter overrides, port maps) of the immediate child instances. For example, if a design unit is flavored, its instance and its parent instances are also flavored.

Flavors are the altered copies of the master definition created for representing connectivity of an HDL design. As described above, the creation of explicit OOMR paths lead to flavor generation. Different instances of a cell may be associated with different flavors of the cell. The method described above relies on generation and management of such flavors of the master definition. In the following example, flavor generation and management for OOMRs are described.

During explicit path generation of OOMRs, the flavor signature of the master is defined using the following information: 1) number of OOMRs associated; 2) the local nets that are targeted from the master definition if there are target OOMRs present; and 3) the instantiation statements of the immediate children. In other words, the instances having the same values for the above three conditions are bound to the same flavor of the master definition. FIG. 9 illustrates various instances of Cell1 of FIG. 3.

FIG. 9 illustrates a method for flavor generation of master definition Cell1 of FIG. 3 according to an embodiment of the present invention. As shown in FIG. 9, the instances top.i1 and top.i2.i1 share the same master definition while the instances top.i2.i7 and top.i6.i7 require different master definition. Therefore, there are three flavors of the master definition required for Cell1 as shown in FIG. 10.

FIG. 10 illustrates flavor definitions of Cell1 of FIG. 3 according to an embodiment of the present invention. Note that flavor1 is the same as provided by the user in the design while flavor2 includes an additional port "x". Flavor1 is used for the instance top.i2.i7 while flavor2 is required for instances top.i1 and top.i2.i1 (see FIG. 3). The instances top.i1 and top.i2.i1 have target OOMRs in them (net x), so an additional port is required in the master definition to create the explicit OOMR path. The instance top.i6.i7 also has a target OOMR on a different net (net y), which leads to a new flavor. Similarly, instances top.i2 and top.i6 require different flavors of Cell2. This is because in instance top.i2, the instantiation statements of immediate child (i7) of Cell2 may change due to pass-through OOMR path ends on net x in one case and ends on net y in another case.

In yet other embodiments, various techniques are employed for optimizing the number of flavors used for a give design unit. The method creates a design unit definition that can be reused for as many instances as possible. The following situations are described below: 1) for flavors generated due to target OOMR, the same design unit definition can be reused independent of where in the design the OOMR is referenced from (as shown in association with the discussion of FIG. 9, top.i1 and top.i2.i1 can share the same design unit definition ); 2) for flavors generated due to pass-though OOMRs, the total of number of pass-through OOMRs and the list of immediate children they get passed into can be used to determine a unique flavor, and such a flavor can be reused independent of the actual resolved values of the OOMRs; and 3) for flavors generated due to reference OOMR, the number of reference OOMRs is used to define a flavor. A design unit definition containing a reference OOMRs can be reused for various instances without the resolved value of the reference OOMRs. This is because a consistent naming scheme is used for reference OOMRs. For example, a single definition of design unit Cell3 can be used for all its instances in the design even though the reference OOMRs used inside Cell3 resolves to different nets in the design in different instances.

One of the advantages of the disclosed examples described above is that mapping of complex HDL language constructs is performed while preserving hierarchy compaction. In addition, the above examples illustrate that HDL language constructs can be abstracted and dealt with in a generic way to preserve hierarchy compaction using a property based flavoring mechanism. Moreover, the flavoring mechanism described herein leads to an optimized approach to hierarchical cell generation. The abstraction applied to the HDL constructs allows the algorithms to be integrated and to work seamlessly in designs containing both Verilog-AMS and VHDL-AMS. This aspect is important for resolving analog connectivity that passes from one language to another, for example, an OOMR from the Verilog-AMS domain that passes through the VHDL-AMS domain.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are to be seen as references to suitable means for providing the described functionality rather than indicative of a strict logical or physical structure or organization.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for representing analog connectivity in a design written in a hardware description language, comprising:
   detecting a circuit component that does not have explicit connection path in the design, wherein the circuit component includes a Verilog-AMS out-of-module-reference, a Verilog-AMS defined parameter, and a VHDL-AMS package reference, and wherein the circuit component includes one or more lower-level circuit instances arranged in one or more branches in a hierarchical graph, representations of a lower-level circuit instance vary from one branch to another branch due to out-of-module-reference, automatic inserted connection module, Verilog-AMS defined parameter, VHDL-AMS package reference, VHDL-AMS entity, VHDL-AMS architecture, and VHDL-AMS instance;
   creating one or more instances of the circuit component having at least one additional port than the circuit component;
   creating one or more ports in the corresponding one or more instances of the circuit component for providing at least an explicit connection path; and
   simulating the design using at least the explicit connection path and the one or more ports of the corresponding one or more instances.

2. The method of claim 1, wherein the out-of-module-reference comprises:
   one or more objects referenced from other parts of the design;
   one or more objects referenced through hierarchical names; and
   one or more objects resided in instances in the hierarchical path from a source instance to a destination instance.

3. The method of claim 1 further comprising:
   detecting an implicit circuit component in the design;

creating one or more instances of the implicit circuit component having at least one additional port than the implicit circuit component;

creating one or more ports in the corresponding one or more instances of the implicit circuit component for providing at least an explicit connection path; and representing the design using the implicit circuit component and the one or more ports of the corresponding one or more instances of the implicit circuit component.

4. The method of claim 3, wherein the implicit circuit component comprises:

one or more instances of a cell that vary from one instance to another instance;

one or more instances of a cell whose instantiations of automatic inserted connection module vary from one instance to another instance; and one or more instances that require explicit creation of additional analog nets after inserting automatic inserted connection modules to represent converted analog values.

5. A method for representing analog connectivity in a design written in a hardware description language, comprising:

detecting a circuit component that does not have explicit connection path in the design, wherein the circuit component includes a Verilog-AMS out-of-module-reference, a Verilog-AMS defined parameter, and a VHDL-AMS package reference, and wherein the circuit component includes one or more lower-level circuit instances arranged in one or more branches in a hierarchical graph;

creating one or more instances of the circuit component having at least one additional port than the circuit component;

creating one or more ports in the corresponding one or more instances of the circuit component for providing at least an explicit connection path;

representing the design using at least the explicit connection path and the one or more ports of the corresponding one or more instances;

creating multiple copies of the circuit component based on the design represented, wherein representations of a lower-level circuit instance vary from one branch to another branch due to out-of-module-reference, automatic inserted connection module, Verilog-AMS defined parameter, VHDL-AMS package reference, VHDL-AMS entity, VHDL-AMS architecture, and VHDL-AMS instance; and simulating the design using the multiple copies of the circuit component.

6. The method of claim 5, wherein creating multiple copies of the circuit component comprises:

creating multiple copies in response to number and type of out-of module-references associated with the circuit component;

creating multiple copies in response to number, type, and location of automatic inserted connection modules of the circuit component;

creating multiple copies in response to parameters of the immediate child instance of the circuit component;

creating multiple copies in response to instantiations of the immediate child instance of the circuit component;

creating multiple copies in response to VHDL-AMS entity to architecture binding of the circuit component; and creating multiple copies in response to VHDL-AMS configuration specifications of the circuit component.

7. The method of claim 5, further comprising:

optimizing the design by reducing the number of copies of the circuit component.

8. The method of claim 7, wherein optimizing the design comprises:

reusing a copy of the circuit component in response to the circuit component includes one or more objects referenced from other parts of the design;

reusing a copy of the circuit component in response to being able to determine a unique copy using one or more objects resided in instances in the hierarchical path and a list of immediate child instances; and reusing a copy of the circuit component in response to being able to define a copy using one or more objects referenced through hierarchical names.

9. A system for representing analog connectivity in a design written in a hardware description language, comprising:

at least one processing unit for executing computer programs;

a user interface for performing at least one of the functions selected from the group consisting of entering a netlist representation of the circuit and viewing representations of the circuit on a display;

a memory for storing the computer programs;

means for detecting a circuit component that does not have explicit connection path in the design, wherein the circuit component includes a Verilog-AMS out-of-module-reference, a Verilog-AMS defined parameter, and a VHDL-AMS package reference, and wherein the circuit component includes one or more lower-level circuit instances arranged in one or more branches in a hierarchical graph, representations of a lower-level circuit instance vary from one branch to another branch due to out-of-module-reference, automatic inserted connection module, Verilog-AMS defined parameter, VHDL-AMS package reference, VHDL-AMS entity, VHDL-AMS architecture, and VHDL-AMS instance;

means for creating one or more instances of the circuit component having at least one additional port than the circuit component;

means for creating one or more ports in the corresponding one or more instances of the circuit component for providing at least an explicit connection path; and means for simulating the design using at least the explicit connection path and the one or more ports of the corresponding one or more instances.

10. The system of claim 9, wherein the out-of-module-reference comprises:

one or more objects referenced from other parts of the design;

one or more objects referenced through hierarchical names; and one or more objects resided in instances in the hierarchical path from a source instance to a destination instance.

11. The system of claim 9 further comprising:

means for creating multiple copies of the circuit component, wherein representations of a lower-level circuit instance vary from one branch to another branch due to at least out-of-module-reference, automatic inserted connection module, Verilog-AMS defined parameter, or VHDL-AMS package reference; and means for representing the design using the multiple copies of the circuit component.

12. The system of claim 11, wherein the means for creating multiple copies of the circuit component comprises:
- means for creating multiple copies in response to number and type of out-of-module-references associated with the circuit component;
- means for creating multiple copies in response to number, type, and location of automatic inserted connection modules of the circuit component;
- means for creating multiple copies in response to parameters of the immediate child instance of the circuit component;
- means for creating multiple copies in response to instantiations of the immediate child instance of the circuit component;
- means for creating multiple copies in response to VHDL-AMS entity to architecture binding of the circuit component; and
- means for creating multiple copies in response to VHDL-AMS configuration specifications of the circuit component.

13. The system of claim 11 further comprising:
- means for optimizing the design by reducing the number of copies of the circuit component.

14. The system of claim 13, wherein the means for optimizing the design comprises:
- means for reusing a copy of the circuit component in response to the circuit component includes one or more objects referenced from other parts of the design;
- means for reusing a copy of the circuit component in response to being able to determine a unique copy using one or more objects resided in instances in the hierarchical path and a list of immediate child instances; and
- means for reusing a copy of the circuit component in response to being able to define a copy using one or more objects referenced through hierarchical names.

15. The system of claim 9 further comprising:
- means for detecting an implicit circuit component in the design;
- means for creating one or more instances of the implicit circuit component having at least one additional port than the implicit circuit component;
- means for creating one or more ports in the corresponding one or more instances of the implicit circuit component for providing at least an explicit connection path; and
- means for representing the design using the implicit circuit component and the one or more ports of the corresponding one or more instances of the implicit circuit component.

16. The system of claim 15, wherein the implicit circuit component comprises:
- one or more instances of a cell that vary from one instance to another instance;
- one or more instances of a cell whose instantiations of automatic inserted connection module vary from one instance to another instance; and
- one or more instances that require explicit creation of additional analog nets after inserting automatic inserted connection modules to represent converted analog values.

17. A computer program product for representing analog connectivity in a design written in a hardware description language, comprising a medium storing executable program code, the computer program product comprising:
- code for detecting a circuit component that does not have explicit connection path in the design, wherein the circuit component includes a Verilog-AMS out-of-module-reference, a Verilog-AMS defined parameter, and a VHDL-AMS package reference, and wherein the circuit component includes one or more lower-level circuit instances arranged in one or more branches in a hierarchical graph, representations of a lower-level circuit instance vary from one branch to another branch due to out-of-module-reference, automatic inserted connection module, Verilog-AMS defined parameter, VHDL-AMS package reference, VHDL-AMS entity, VHDL-AMS architecture, and VHDL-AMS instance;
- code for creating one or more instances of the circuit component having at least one additional port than the circuit component;
- code for creating one or more ports in the corresponding one or more instances of the circuit component for providing at least an explicit connection path; and
- code for simulating the design using at least the explicit connection path and the one or more ports of the corresponding one or more instances.

18. The computer program product of claim 17, wherein the out-of-module-reference comprises:
- one or more objects referenced from other parts of the design;
- one or more objects referenced through hierarchical names; and
- one or more objects resided in instances in the hierarchical path from a source instance to a destination instance.

19. The computer program product of claim 17 further comprising:
- code for creating multiple copies of the circuit component, wherein representations of a lower-level circuit instance vary from one branch to another branch due to at least out-of-module-reference, automatic inserted connection module, Verilog-AMS defined parameter, or VHDL-AMS package reference; and
- code for representing the design using the multiple copies of the circuit component.

20. The computer program product of claim 19, wherein the code for creating multiple copies of the circuit component comprises:
- code for creating multiple copies in response to number and type of out-of-module-references associated with the circuit component;
- code for creating multiple copies in response to number, type, and location of automatic inserted connection modules of the circuit component;
- code for creating multiple copies in response to parameters of the immediate child instance of the circuit component;
- code for creating multiple copies in response to instantiations of the immediate child instance of the circuit component;
- code for creating multiple copies in response to VHDL-AMS entity to architecture binding of the circuit component; and
- code for creating multiple copies in response to VHDL-AMS configuration specifications of the circuit component.

21. The computer program product of claim 19 further comprising:
- code for optimizing the design by reducing the number of copies of the circuit component.

22. The computer program product of claim 21, wherein the code for optimizing the design comprises:
- code for reusing a copy of the circuit component in response to the circuit component includes one or more objects referenced from other parts of the design;
- code for reusing a copy of the circuit component in response to being able to determine a unique copy using one or more objects resided in instances in the hierarchical path and a list of immediate child instances; and code for reusing a copy of the circuit component in response to being able to define a copy using one or more objects referenced through hierarchical names.

23. The computer program product of claim 17 further comprising:

code for detecting an implicit circuit component in the design;

code for creating one or more instances of the implicit circuit component having at least one additional port than the implicit circuit component;

code for creating one or more ports in the corresponding one or more instances of the implicit circuit component for providing at least an explicit connection path; and code for representing the design using the implicit circuit component and the one or more ports of the corresponding one or more instances of the implicit circuit component.

24. The computer program product of claim 23, wherein the implicit circuit component comprises:

one or more instances of a cell that vary from one instance to another instance;

one or more instances of a cell whose instantiations of automatic inserted connection module vary from one instance to another instance; and one or more instances that require explicit creation of additional analog nets after inserting automatic inserted connection modules to represent converted analog values.

* * * * *